US010867152B2

(12) United States Patent
Mainguet et al.

(10) Patent No.: US 10,867,152 B2
(45) Date of Patent: Dec. 15, 2020

(54) ACTIVE THERMAL PATTERN SENSOR COMPRISING A PASSIVE MATRIX OF PIXELS

(71) Applicants: COMMISSARIAT À L'ÉNERGIE ATOMIQUE ET AUX ÉNERGIES ALTERNATIVES, Paris (FR); Idemia Identity & Security France, Issy-les-Moulineaux (FR)

(72) Inventors: Jean-François Mainguet, Grenoble (FR); Joël Yann Fourre, Moissy-Cramayel (FR); Josep Segura Puchades, Fontaine (FR)

(73) Assignee: COMMISSARIAT À L'ÉNERGIE ATOMIQUE ET AUX ÉNERGIES ALTERNATIVES, Paris (FR)

( * ) Notice: Subject to any disclaimer, the term of this patent is extended or adjusted under 35 U.S.C. 154(b) by 0 days.

(21) Appl. No.: 16/320,172

(22) PCT Filed: Jul. 27, 2017

(86) PCT No.: PCT/FR2017/052118
§ 371 (c)(1),
(2) Date: Jan. 24, 2019

(87) PCT Pub. No.: WO2018/020176
PCT Pub. Date: Feb. 1, 2018

(65) Prior Publication Data
US 2020/0026897 A1    Jan. 23, 2020

(30) Foreign Application Priority Data

Jul. 29, 2016    (FR) ..................................... 16 57391

(51) Int. Cl.
*H01L 27/16* (2006.01)
*H01L 37/02* (2006.01)
(Continued)

(52) U.S. Cl.
CPC .......... *G06K 9/0002* (2013.01); *G06K 9/209* (2013.01); *H01L 27/16* (2013.01); *H01L 37/02* (2013.01); *G06K 9/00053* (2013.01)

(58) Field of Classification Search
CPC ....... H01L 41/04; H01L 41/047; H01L 41/08; H01L 41/0805; H01L 41/0815;
(Continued)

(56) References Cited

U.S. PATENT DOCUMENTS 4,394,773 A    7/1983 Ruell
4,429,413 A    1/1984 Edwards
(Continued)

FOREIGN PATENT DOCUMENTS

EP    0840250 A1    5/1998
EP    1469415 A2    10/2004
EP    2385486 A1    11/2011

OTHER PUBLICATIONS

Article published in Wikipedia, "Active pixel sensor," Jun. 15, 2016.
(Continued)

*Primary Examiner* — Natalia A Gondarenko
(74) *Attorney, Agent, or Firm* — Pearne & Gordon LLP

(57) ABSTRACT

Thermal pattern sensor including a matrix of multiple rows and columns of pixels, each pixel comprising: - a pyroelectric capacitor comprising a pyroelectric portion positioned between lower and upper electrodes, in which a first of these electrodes forms a readout electrode; and —a heating element that is capable of heating the pyroelectric portion of said pixel; and in which: - for each row of pixels, the heating elements are capable of heating the pyroelectric portion of the pixels of the row independently of the heating elements of the pixels of the other rows; and —for each column of pixels, the readout electrodes of each pixel are electrically
(Continued)

linked to one another and are formed by a first electrically conductive portion that makes contact with the pyroelectric portions of the pixels of the column, and that is separate from the first portions of the other columns.

13 Claims, 4 Drawing Sheets

(51) Int. Cl.
   *G06K 9/00* (2006.01)
   *G06K 9/20* (2006.01)

(58) Field of Classification Search
   CPC ............... H01L 41/0825; H01L 41/083; H01L 41/1132; H01L 41/27; H01L 41/273; H01L 41/277; H01L 41/29; H01L 41/293; H01L 41/31; H01L 37/02; H01L 37/025; H01L 27/16; H01L 27/20; H01L 23/34; H01L 23/345; H01L 23/36; H01L 23/4824; H01L 23/49589; H01L 23/5222; H01L 23/5283; H01L 23/5286; H01L 23/53214; H01L 23/53219; H01L 23/647; H01L 28/20; H01L 28/40–57; H01L 28/60; H01L 29/86; H01L 29/8605; H01L 29/92; G06K 9/00006; G06K 9/0002; G06K 9/209; G06K 9/00053
   USPC ..................... 257/467, 295, 252; 438/54, 57
   See application file for complete search history.

(56) References Cited

U.S. PATENT DOCUMENTS

| | | | |
|---|---|---|---|
| 4,873,455 A * | 10/1989 | de Chambost | B82Y 10/00 706/33 |
| 6,061,464 A | 5/2000 | Leger | |
| 6,091,837 A | 7/2000 | Dinh | |
| 6,289,114 B1 | 9/2001 | Mainguet | |
| 7,385,381 B1 * | 6/2008 | Mainguet | G01D 5/2405 324/71.1 |
| 8,801,274 B2 * | 8/2014 | Mainguet | G01J 5/024 374/102 |
| 2004/0206190 A1 | 10/2004 | Kawahata | |
| 2005/0224849 A1 * | 10/2005 | Isenberger | G11C 11/22 257/295 |
| 2006/0050935 A1 * | 3/2006 | Bustgens | G06K 9/0002 382/124 |
| 2011/0280276 A1 | 11/2011 | Mainguet et al. | |
| 2018/0032781 A1 | 2/2018 | Mainguet et al. | |
| 2018/0032782 A1 | 2/2018 | Mainguet et al. | |
| 2018/0240843 A1 | 8/2018 | Mainguet et al. | |
| 2018/0269240 A1 | 9/2018 | Mainguet et al. | |
| 2018/0356291 A1 | 12/2018 | Mainguet et al. | |
| 2019/0005296 A1 | 1/2019 | Mainguet et al. | |
| 2019/0012513 A1 | 1/2019 | Mainguet et al. | |
| 2019/0025129 A1 | 1/2019 | Mainguet et al. | |
| 2019/0148618 A1 | 5/2019 | Revaux et al. | |

OTHER PUBLICATIONS

U.S. Appl. No. 15/779,738, titled "Method for Capturing a Heat Pattern", filed May 29, 2018.
U.S. Appl. No. 16/230,162 titled "Pyroelectric Sensor With Improved Electromagnetic Sheilding". filed Dec. 21, 2018.
International Search Report for International Application No. PCT/FR2017/052118, dated Oct. 20, 2017.
Written Opinion for International Application No. PCT/FR2017/052118, dated Oct. 20, 2017.
Preliminary French Search Report for Application No. 16 57391, dated Apr. 26, 2017.

* cited by examiner

ACTIVE THERMAL PATTERN SENSOR COMPRISING A PASSIVE MATRIX OF PIXELS

CROSS-REFERENCE TO RELATED APPLICATIONS

This is a National Stage application of PCT international application PCT/FR2017/052118, filed on Jul. 17, 2017, which claims the priority of French Patent Application No. 16 57391, filed Jul. 29, 2016, both of which are incorporated herein by reference in their entirety.

TECHNICAL FIELD AND PRIOR ART

The invention relates to a thermal pattern sensor, for example a finger print sensor, carrying out an active thermal detection and including a passive matrix of pixels.

A finger print sensor comprises thermal detection means. These thermal detection means may correspond to pyroelectric elements, diodes, thermistors or any other temperature sensitive element making it possible to convert a variation in temperature into a variation in potential or electric current.

Finger print detection may be carried out by so-named "passive" sensors exploiting a difference in temperature between the finger and the sensor, as described in the documents U.S. Pat. No. 4 394 773, U.S. Pat. No. 4 429 413 and U.S. Pat. No. 6 289 114. These sensors have however the drawback of carrying out a measurement that depends uniquely on the temperature difference between the finger and the sensor. It may thus happen that the level of the signal obtained is zero when the finger and the sensor are at the same temperature (for example when the finger remains on the sensor for a certain time), or that the contrast of the captured images varies and then poses problems during the later processing of the images.

To eliminate the problems raised by passive thermal sensors, notably in the case of a static acquisition where the finger does not move, so-named "active" print sensors have been proposed, such as for example that described in the documents U.S. Pat. No. 6 091 837 and EP 2 385 486 A1. In such a sensor, each pixel comprises a pyroelectric capacitance formed of two conductive electrodes between which a portion of pyroelectric material is arranged, and a heating element. This heating element dissipates a certain amount of heat in the pixel, and the heating of the pixel is measured at the end of a certain acquisition time, named integration time, in the presence of the finger on the sensor. This makes it possible to distinguish, at each pixel, the presence of a ridge or a valley of the detected print depending on whether the heat is absorbed by the skin (pixel in the presence of a ridge of the print) or conserved in the pixel (pixel in the presence of a valley of the print). This leads to a lower final temperature in the case of a pixel in the presence of a ridge, where the heat is absorbed by the skin, compared to a pixel in the presence of a valley.

To the first order, such a sensor makes it possible to measure the calorific capacity, also named specific heat capacity, of an element in contact with the sensor. The measurements obtained also depend on the thermal conductivity between the sensor and the part of the element (ridge or valley in the case of a finger print) in presence.

To form an active thermal sensor, the pixels of this sensor are coupled to heating elements generally using the Joule effect, which dissipates heat from a resistive element through which a current flows. One of the levels of the technological stack forming the pixels is advantageously used to form these heating elements. For example, it is possible to use one of the electrically conductive levels serving to produce the transistors and the interconnections of the sensor if one of these levels comprises a conductive material having a suitable resistivity and to which it suffices to apply one of the voltages already available, for example the supply voltage of the sensor, to generate a heating by Joule effect. This is notably used when the sensor comprises transistors of TFT (Thin-Film Transistor) type produced on a glass or plastic substrate.

The pixels of such a sensor are arranged by forming a matrix of several lines and several columns. The reading of the pixels is generally carried out line by line. The heating elements may then also be controlled by line using a transistor located at the head of each line, thereby avoiding the addition of control transistors in each of the pixels. Each line of heating elements is for example connected, on one side of the matrix of pixels, to ground, and on the other side to the control transistor associated with the line of pixels and connected to a supply adapted to the manner of controlling the current flowing through the heating elements, and thus the thermal power injected by Joule effect into the pixels by these heating elements.

To carry out a reading of the variation in the number of electrical charges appearing in the pyroelectric capacitance of each pixel of an active thermal sensor, each of the pixels comprises at least one selection transistor, and the selection transistors of the pixels of each column of pixels are connected to a conductive line, itself connected to a reading circuit. During the reading of a line of pixels, the selection transistors of the pixels of this line are turned on, which makes it possible to connect the active nodes of the pixels of this line to the reading circuits located at the base of each of the columns of pixels. The blocked selection transistors of the pixels belonging to the other lines of pixels prevent the displacement of charges from these other pixels to the reading circuits. Other transistors may also be present in each pixel, notably when the pixels are voltage read and when they require the presence of a reset transistor and a voltage follower transistor, or that the sensor also forms an optical sensor in which a transistor is present in each pixel to connect a photodiode of each pixel to a dedicated reading circuit.

Yet, the presence of these transistors within the matrix of pixels represents a technological constraint and a significant cost in the production of the sensor.

DESCRIPTION OF THE INVENTION

An aim of the present invention is to propose an active thermal pattern sensor, that is to say comprising elements heating the pixels of the sensor, comprising a passive matrix of pixels, that is to say the structure of which enables reading of the pixels without resorting to transistors present in each of the pixels.

To do so, the invention proposes a thermal pattern sensor comprising a matrix of several lines and columns of pixels, each pixel including at least:
  a pyroelectric capacitance formed by at least one portion of pyroelectric material arranged between a lower electrode and an upper electrode, in which a first of the lower and upper electrodes corresponds to a reading electrode of the pixel, and
  a heating element able to heat the portion of pyroelectric material of the pyroelectric capacitance of said pixel during a measurement of the thermal pattern by the pyroelectric capacitance of said pixel, and in which:

for each line of pixels, the heating elements of the pixels of said line are able to heat the portions of pyroelectric material of the pixels of said line independently of the heating elements of the pixels of the other lines, and for each column of pixels, the reading electrodes of each pixel of said column are electrically connected together and formed by at least one first electrically conductive portion in contact with the portions of pyroelectric material of the pixels of said column and distinct from the first electrically conductive portions forming the reading electrodes of the pixels of the other columns.

This sensor corresponds to an active sensor (because including heated pixels) produced with a matrix of passive pixels, that is to say without transistors present within the pixels. Thus, the production of this sensor is not limited by the technology required to produce transistors within the matrix of pixels, and may implement steps adapted to a production on a semiconductor substrate such as silicon, or a substrate on glass, but also to be produced using printed electronics technology, for example on a flexible substrate.

Without transistors within the matrix of pixels, the manufacture of the matrix of pixels is simplified and can be summed up as the capacity to produce networks of parallel conductive lines at the desired resolution. This becomes possible with methods that are less expensive than lithography on semiconductor: lithographies such as those implemented to produce printed circuits, printing (photogravure, offset etching, etc.), laser structuring, etc. The different conductive portions forming the elements of the pixels of the sensor may be produced with conductive inks that are sufficiently stable so as not to require high performance encapsulation. The production at very low cost of the sensor may be envisaged by printing, for example on simple plastic substrates (PET films).

The sensor according to the invention carries out a thermal detection and does not correspond to a capacitive type sensor because in the sensor according to the invention, it is the generated pyroelectric charges that are read and not a capacitance value. No injection of charges is carried out in the sensor according to the invention.

Such a sensor also has the advantage of reducing the number of signals required for its management due to the fact that the selection of a line of pixels is carried out through heating the pixels, which is carried out line by line.

The element including the thermal pattern intended to be detected by the sensor is intended to be in physical contact with the sensor, that is to say arranged against the sensor during the detection of this thermal pattern.

For each line of pixels, the heating elements of the pixels of said line are able to be controlled independently of the heating elements of the pixels of the other lines.

According to one embodiment, the thermal pattern sensor may be such that:

in each pixel, a second of the lower and upper electrodes corresponds to a biasing electrode of the pixel distinct from the heating elements, and in each line of pixels, the heating elements and the biasing electrodes of the pixels of said line are juxtaposed and arranged on or under the portions of pyroelectric material of the pixels of said line.

According to another embodiment, the thermal pattern sensor may be such that in each line of pixels, at least one second electrically conductive portion forms both the heating element and a second of the lower and upper electrodes of each of the pixels of said line.

The sensor may further comprise a dielectric layer covering the upper electrode of each pixel of the matrix and a first electrically conductive layer arranged on said dielectric layer. This first electrically conductive layer forms an electromagnetic shielding of the sensor making it possible to reduce electromagnetic noise coming for example from the finger laid on the sensor.

According to another embodiment, the sensor may be such that:

a second of the lower and upper electrodes of each pixel is formed by a second electrically conductive layer common to all the pixels of the matrix and able to be electrically connected to a reference electrical potential, and in each line of pixels, at least one second electrically conductive portion may form the heating elements of the pixels.

In this case, the second electrically conductive layer forms an electromagnetic shielding layer of the sensor.

The second electrically conductive layer may be arranged between the heating elements and the reading electrodes. In this case, the second electrically conductive layer forms both the second electrodes and an electromagnetic shielding layer.

Each second electrically conductive portion may also comprise, in each pixel, parts of which the electrical resistance is greater than that of the remainder of said second electrically conductive portion. Such a configuration is advantageous and makes it possible to limit diathermy between the pixels of the sensor.

For each line of pixels, the heating elements of each pixel of said line may be electrically connected together and formed by at least one second electrically conductive portion distinct from the heating elements of the other lines of pixels and able to heat simultaneously all the portions of pyroelectric material of the pixels of said line.

Advantageously, the reading electrodes may correspond to the lower electrodes of the pixels. In this case, the element including the thermal pattern intended to be detected by the sensor is intended to be in contact with the sensor on the side of the upper electrodes of the pixels, that is to say on the side of the front face of the sensor, for example on a protective layer covering the sensor.

However, it is possible that the reading electrodes correspond to the upper electrodes of the pixels. In this case, the element including the thermal pattern intended to be detected by the sensor is intended to be in contact with the sensor on the side of the lower electrodes of the pixels, that is to say on the side of the rear face of the sensor, for example against the rear face of the substrate on which the different elements of the sensor are produced.

Each of the heating elements may comprise several superimposed electrically conductive portions.

The invention also pertains to a method for producing a thermal pattern sensor comprising a matrix of several lines and columns of pixels, including at least the implementation of the following steps:

producing, for each pixel, a pyroelectric capacitance formed by at least one portion of pyroelectric material arranged between a lower electrode and an upper electrode, in which a first of the lower and upper electrodes corresponds to a reading electrode of the pixel, and producing a heating element able to heat the portion of pyroelectric material of the pyroelectric capacitance of said pixel during a measurement of the thermal pattern by the pyroelectric capacitance of said pixel, and in which:

for each line of pixels, the heating elements of the pixels of said line are able to heat the portions of pyroelectric material of the pixels of said line independently of the heating elements of the pixels of the other lines, and for each column of pixels, the reading electrodes of each pixel of said column are electrically connected together and formed by at least one first electrically conductive portion in contact with the portions of pyroelectric material of the pixels of said column and distinct from the first electrically conductive portions forming the reading electrodes of the pixels of the other columns.

The production of the lower electrodes of the pixels and/or the upper electrodes of the pixels and/or the heating elements of the pixels may comprise the implementation of at least one deposition by printing of at least one electrically conductive material, advantageously an electrically conductive ink.

BRIEF DESCRIPTION OF THE DRAWINGS

The present invention will be better understood on reading the description of exemplary embodiments given for purely illustrative purposes and in no way limiting while referring to the appended drawings in which.

Identical, similar or equivalent parts of the different figures described hereafter bear the same numerical references so as to make it easier to go from one figure to the next.

The different parts shown in the figures are not necessarily according to a uniform scale, in order to make the figures easier to read.

The different possibilities (alternatives and embodiments) should be understood as not being mutually exclusive and may be combined together.

DETAILED DESCRIPTION OF PARTICULAR EMBODIMENTS

Figure 1:
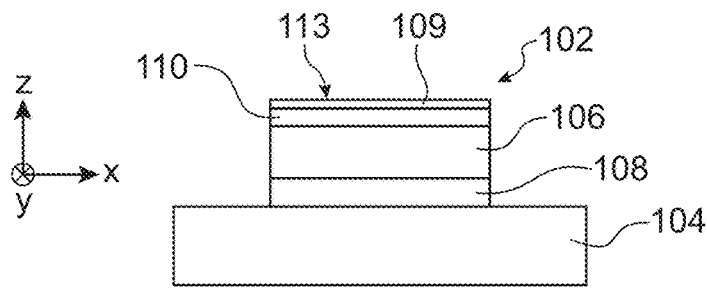
FIG. 1 shows a sectional view of a part of a pixel of a thermal pattern sensor, the subject matter of the present invention.

Reference will firstly be made to FIG. 1, which shows a sectional view of a part of a pixel 102 of a thermal pattern sensor 100.

The pixel 102 is produced on a substrate 104 corresponding for example to a glass or semiconductor (for example silicon) substrate. The substrate 104 may also be a flexible substrate, for example comprising polyimide or PEN (polyethylene naphthalate) or PET (polyethylene terephthalate), on which the electronic elements of the sensor 100, such as TFTs, are produced by printed electronics technology (for example via production with ink jet type writing heads) or by lithography.

The pixels 102 of the sensor 100 are arranged by forming a matrix of several lines and several columns of pixels 102. The pitch of the pixels 102, in the plane (X,Y) (that is to say the plane of the substrate 104), is for example between around 50 μm and 100 μm. In the case of a sensor 100 of resolution equal to 500 dpi (dots per inch), the pitch of the pixels 102 is equal to 50.8 μm.

Each of the pixels 102 of the sensor 100 comprises thermal measurement, or detection, means formed by a pyroelectric capacitance. Each pyroelectric capacitance comprises a portion 106 of pyroelectric material arranged between a lower electrode 108 and an upper electrode 110. The pyroelectric material of the portion 106 is advantageously P(VDF-TrFE) or PVDF. In an alternative, the pyroelectric material of the portion 106 may be AlN or PZT, or any other pyroelectric material suited to form a pyroelectric capacitance. The thickness of the portion 106 is for example between around 500 nm and 10 μm.

The electrodes 108, 110 each comprise at least one electrically conductive material, for example a metal material such as titanium of thickness equal to around 0.2 μm, and/or molybdenum and/or aluminium and/or a conductive oxide such as ITO (indium tin oxide) and/or a conductive polymer. One of the electrodes 108, 110, advantageously the upper electrode 110, or each of the two electrodes 108, 110, may be formed by a stack of several electrically conductive materials, for example a Ti/TiN/AlCu stack. The thickness of each of the electrodes 108, 110 is for example between around 0.1 μm and 1 μm. The thickness of each of the electrodes 108, 110 may be greater, going for example up to around 5 μm, notably when these electrodes are produced by printing using materials such as silver, copper, carbon or PEDOT(poly(3,4-ethylenedioxythiophene).

A protective layer 109, corresponding for example to a layer of aluminium nitride or any other material suited to the production of this layer, covers the upper electrode 110. The thickness of the protective layer 109 may be between several microns and around 100 μm, or instead much more (for example of the order of 300 μm or more). An upper face 113 of the protective layer 109 corresponds to the surface above which is located the thermal pattern intended to be detected, for example a finger of which the print is intended to be detected.

In order that the PVDF of the portion 106 acquires its pyroelectric (and also piezoelectric) properties, this material is subjected, once in the lifetime of the pyroelectric capacitance, to an electric field of around 100 volts per micron thickness of PVDF. The molecules inside the PVDF become oriented, and remain thus oriented, even when the PVDF is no longer subjected to this electric field. The PVDF may be thereby be biased by applying an initial biasing voltage to the terminals of the electrodes 108, 110.

After this initial biasing, when the portion 106 is subjected to a variation in temperature ΔT, this variation in temperature ΔT causes the appearance of an additional electric field generating charges ΔQ between the electrodes 108, 110 such that:

$\Delta Q = S \cdot \gamma \cdot \Delta T$

The parameter S corresponds to the surface of the portion 106 facing each of the electrodes 108, 110. The parameter γ corresponds to the pyroelectric coefficient of the pyroelectric material of the portion 106. For example, the pyroelectric coefficient γ of PVFD-TrFE is equal to around 32 μC/m²/K.

The portion 106 and the electrodes 108, 110 forming a capacitance of value C to which are added the parasitic capacitances Cp, the charges ΔQ generated induce a difference in electrical potentials ΔV between the electrodes 108, 110 such that:

$$(C+C_p)\Delta V = \Delta Q = S \cdot \gamma \cdot \Delta T$$

In addition to the charges generated by the capacitance of value C, other parasitic charges may also be generated via the parasitic capacitances Cp present.

When the potential on the reading electrode (formed by one of the electrodes 108, 110) is fixed (so-named "current reading"), the charges generated flow to the reading circuit while forming an integrated current at the output, with in this case:

$$\frac{\Delta Q}{\zeta} = \frac{S \cdot \gamma \cdot \Delta T}{\zeta}$$

with ζ corresponding to the integration time during which the measurement is carried out by the pixel. Such a current reading has the advantage of being insensitive, to the first order, to the value of the capacitances, in particular the parasitic capacitances.

The direction of the current obtained between the electrodes 108, 110 depends on the direction of the electric field with which the PVDF of the portion 106 has been initially biased. In the case of certain other pyroelectric materials such as aluminium nitride, this initial biasing direction depends on the manner in which the pyroelectric material has been deposited, on its order and on its crystallographic orientation. Moreover, the direction of the current obtained can vary depending on whether the variation in temperature undergone by the pyroelectric capacitance is positive or negative.

The sensor 100 also comprises heating elements dissipating a certain amount of heat in the pixels 102, and notably in the pyroelectric material. These heating elements are for example formed by electrically conductive portions derived from the same layer as that serving for the production of the upper electrodes 110 or lower electrodes 108. In the example of FIG. 1, the heating element is not visible and is produced by a portion of the conductive layer serving for the production of the upper electrodes 110 as described hereafter in relation with FIG. 2.

The heating of the portion 106 of pyroelectric material is obtained by making a current circulate in the heating element forming the heating resistance of each of the pixels 102.

Figure 2:
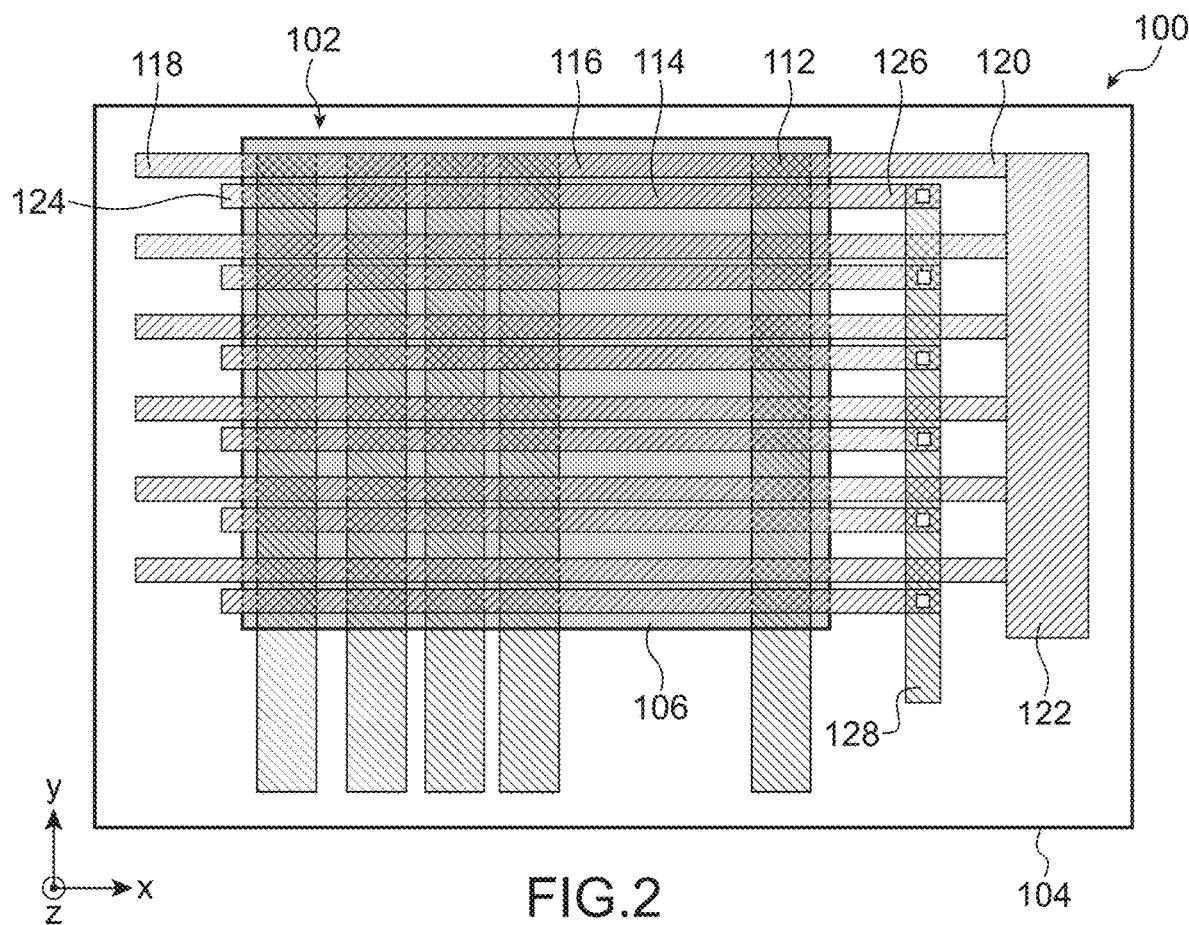
FIG. 2 shows a top view of a part of a thermal pattern sensor, the subject matter of the present invention, according to a first embodiment.

FIG. 2 shows a top view of several pixels 102 of the sensor 100 according to a first embodiment.

The lower electrodes, which here form the reading electrodes of the pixels 102 on which the charges generated by the pyroelectric capacitances will be recovered to be read, are formed by the first portions 112 of electrically conductive material. The lower electrodes of the pixels of a same column are electrically connected together due to the fact that these lower electrodes of the pixels of a same column are formed by a same first conductive portion 112 which extends over the whole length of the column of pixels 102 and which is in contact with the portions 106 of pyroelectric material of all the pixels of the column. Each of the portions 112 extends along a direction parallel to the columns of pixels 102, that is to say here vertically, parallel to the axis Y. Moreover, each of the first electrically conductive portions 112 is distinct from the other first electrically conductive portions 112 forming the reading electrodes of the pixels 102 of the other columns.

At the base of each of the columns of pixels, each of the first conductive portions 112 is electrically connected to a reading circuit (not visible in FIG. 2) common to all the pixels of a same column.

The portions 106 of pyroelectric material of all the pixels of the matrix of the sensor 100 are here produced in the form of a single layer of pyroelectric material covering all the lower electrodes of the pixels 102.

The upper electrodes here correspond to the biasing electrodes of the pixels 102 and are formed by electrically conductive portions 114 each common to all the pixels 102 of a same line of pixels. Each of the portions 114 extends for example along a direction parallel to the lines of pixels 102, that is to say horizontally in FIG. 2, parallel to the axis X.

Thus, in each pixel 102, a pyroelectric capacitance is formed by the parts of the portions 112 and 114 that are superimposed one above the other as well as the pyroelectric material located between these parts of the portions 112 and 114. This superimposition surface of the portions 112, 114 is thus representative of the amount of charges generated, and is preferably the largest possible.

The heating elements of the pixels 102 are formed by electrically conductive portions 116 each common to all the pixels 102 of a same line of pixels, and which are distinct from the portions 114 forming the biasing electrodes of the pixels. Each of the portions 116 here extends along a direction substantially parallel to the lines of pixels 102, that is to say parallel to the axis X in FIG. 2.

The conductive portions 114 and 116 are advantageously derived from a same electrically conductive layer. In FIG. 2, within a same line of pixels 102, the portions 114, 116 are juxtaposed one next to the other, above the pyroelectric material layer.

In the example of FIG. 2, the width (dimension along the axis X, that is to say the dimension located in the plane of the pixels 102 and which is perpendicular to the direction along which the columns of pixels 102 extend) of each of the first conductive portions 112 is constant over their entire length. For example, considering pixels of pitch equal to around 50 μm, the width of each of the first conductive portions 112 may be equal to around 45 μm, these first conductive portions 112 being able to be spaced apart from each other by around 5 μm.

In an alternative, it is possible that the width of each of the first conductive portions 112 is not constant over their entire length. The width of the parts of the first conductive portions 112 located facing the portions 114, 116, that is to say within each of the pixels 102, may be greater than that of the parts of the first conductive portions 112 located between the pixels 102.

According to another alternative, it is possible that the width of the parts of the first electrically conductive portions 112 located facing the portions 114 is greater than that of the parts of the first electrically conductive portions 112 located between the pixels 102 and facing the portions 116. This other alternative has the advantage of reducing parasitic capacitances because in this case, Moreover, only the capacitance formed by the superimposition of the portions 112 and 114 may be biased, in order that the superimposition of the portions 112 and 116 does not generate charges.

Moreover, in the example of FIG. 2, considering pixels of pitch equal to around 50 μm, the width of each of the portions 114, 116 is for example less than or equal to around 20 μm (considering a spacing of around 5 μm between each of these portions).

Each of the portions 116 forming the heating elements of a line of pixels comprises two ends 118, 120 to which a heating voltage is intended to be applied. One of these two ends 118, 120 is for example connected to ground, and a non-zero electrical heating potential is applied to the other of these two ends 118, 120 by heating means for example formed by an electrical connection applying a voltage to this other end. For example, if the ends 120 of the portions 116 are connected to ground and if a heating potential $V_{heat}$ is applied to the end 118 of one of the portions 116, as is the case in FIG. 2, a current then flows from the end 118 up to the end 120 of this portion 116, causing a heating by Joule effect in this portion 116, and thereby heating the pyroelectric material of all the pixels 102 of the line of pixels that is heated by this portion 116.

In the example of FIG. 2, the ends 120 of the portions 116 forming the heating elements are connected to another conductive portion 122 common to all the portions 116 and which is connected to the ground of the sensor 100.

Each of the portions 114 comprises a first end 124 to which a biasing potential is intended to be applied and a second end 126 connected to the ground of the sensor 100. In the example of FIG. 2, the ends 126 of the portions 114 are connected to another conductive portion 128 common to all the lines of pixels and which is connected to the ground of the sensor 100.

The value of the heating voltage applied to the ends 118, 120 of the portions 116 is chosen as a function of the desired heating power, this power being a function notably of the resistivity of the material of the portions 116, the thickness of the portion of pyroelectric material intended to be heated and the thickness of the protective layer 109, the pyroelectric coefficient of the pyroelectric material, the sensitivity of the reading circuit, the noise level of the reading circuit and the integration time. In a pixel 102, the heating power is for example between around 0.1 mW and 10 mW.

In the sensor 100, due to the fact that each portion 116 may be addressed independently of the other portions 116 associated with the other lines of pixels, it is thus possible to trigger the heating of each of the lines of pixels independently of each other. In addition, due to the fact that the lower electrodes of the pixels of a same column are connected together, the charges obtained at the base of each of the conductive portions forming the lower electrodes 108 thus correspond to the charges generated by the pixels belonging to the line of pixels that has been heated.

Thus, the sensor 100 does not resort to any selection transistor within the pixels 102 since by having connected the reading electrodes of the pixels 102 of a same column together, the addressing by line of pixels carried out by the heating elements is sufficient to know which pixels correspond to the electrical charges received by the reading circuits located at the base of columns.

A fixed potential is applied to the portions 114, for example that of ground.

Figure 3:
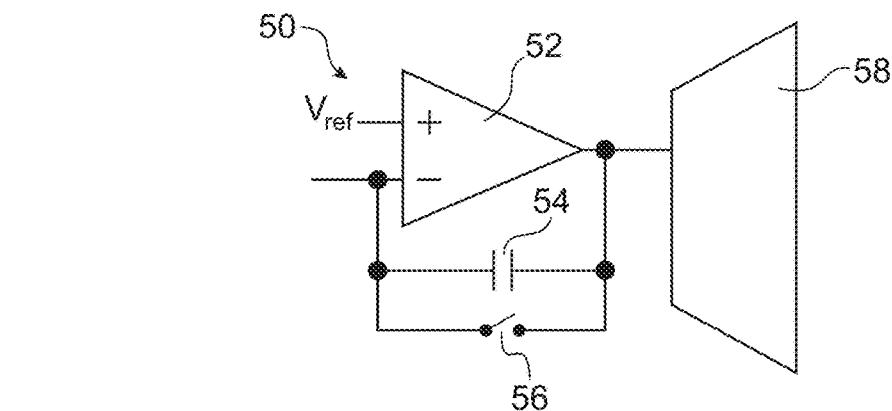
FIG. 3 shows an example of producing a reading circuit associated with a column of pixels of a thermal pattern sensor, the subject matter of the present invention.

An example of producing a reading circuit 50 to which each of the portions 112 (forming the reading electrodes of the pixels 102) is connected is shown in FIG. 3.

The input of the reading circuit 50 to which the portion 112 is connected corresponds to the inverting input of a reading amplifier 52. This reading amplifier 52 here corresponds to an operational amplifier. An electrical biasing potential $V_{ref}$ is applied to the non-inverting input of the amplifier 52. The output of the amplifier 52 is looped back on its inverting input through a capacitance 54. A switch 56, or commutator, is connected in parallel to the capacitance 54 and makes it possible to short-circuit the capacitance 54. The output of the reading amplifier 52 is also connected to the input of an analogue/digital converter 58. The reading amplifier 52, the capacitance 54, the switch 56 and the analogue/digital converter 58 are common to all the pixels 102 of a same column. The analogue/digital converter 58 may be common to all the columns of pixels 102 of the sensor 100, with the addition of electronic multiplexing elements between the outputs of the reading amplifiers 52 associated with the different columns of pixels and the analogue/digital converter 58.

The electronic elements forming the reading circuits 50 may be produced on a substrate different from that on which the pixels 102 are produced, these substrates being able to be assembled to each other later. Thus, the electronic elements of these reading circuits may be produced with a production technology (for example CMOS) different from that serving for the production of the pixels 102 (for example by printing).

In this first embodiment, the heating elements are located at the same level as the biasing electrodes because the portions of electrically conductive material forming the heating elements and those forming the biasing electrodes are derived from a same layer of electrically conductive material. However, it is possible that the heating elements are arranged not directly on the pyroelectric material but beside or above or below the pyroelectric capacitances.

In an alternative, it is possible that the surface against which the thermal pattern intended to be detected is located corresponds to the rear face of the substrate 104, that is to say the face opposite to that on which the electrode 108 rests.

This alternative may be advantageous when the main criterion sought is not the resolution of the sensor 100. In this case, the substrate 104 forms a robust surface with which the finger comes into contact. In addition, the heating elements may in this case be formed by the lower electrodes 108 produced as described previously for the upper electrodes 110. Finally, this alternative makes it possible to position the reading circuits beside the sensitive zone of the sensor 100 but protected because arranged on the side of the substrate 104 opposite to that where the finger is intended to be positioned.

Figure 4:
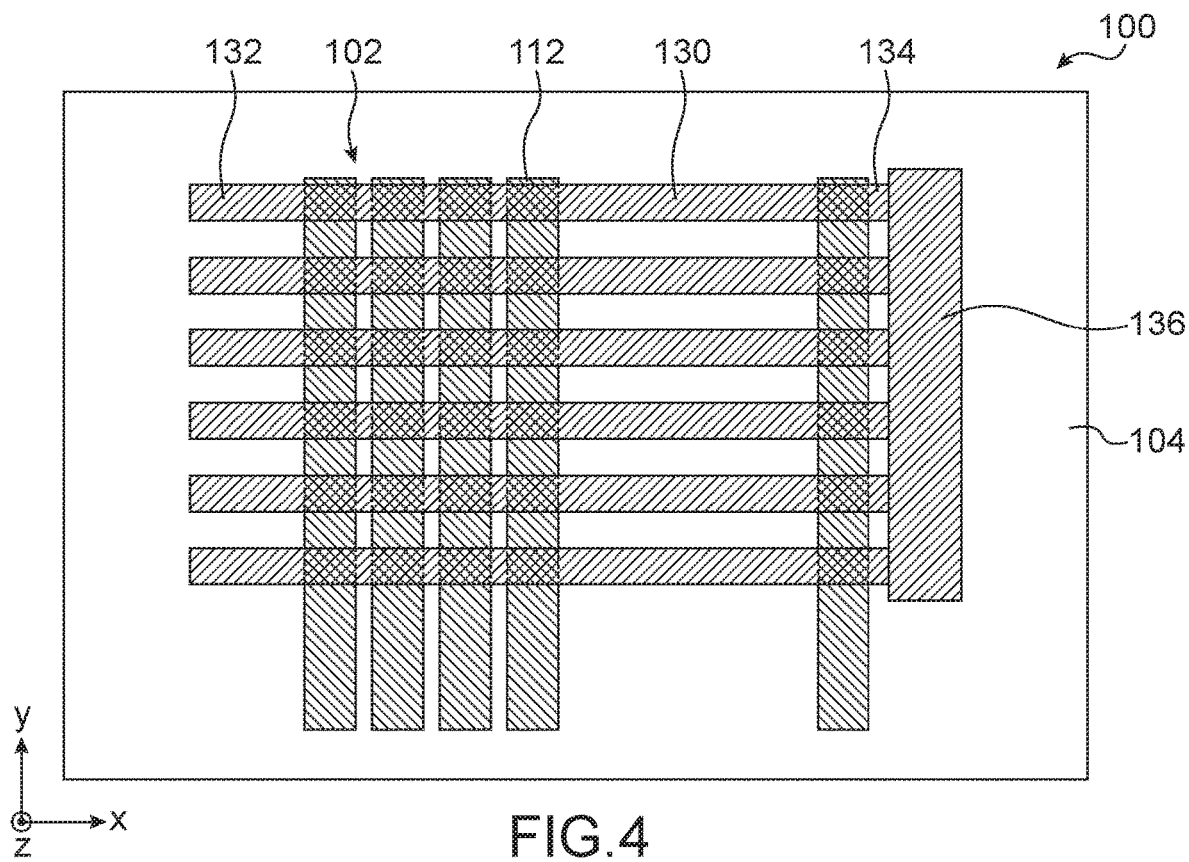
FIG. 4 shows a top view of a part of a thermal pattern sensor, the subject matter of the present invention, according to a second embodiment.

FIG. 4 shows a top view of several pixels 102 of the sensor 100 according to a second embodiment.

Unlike the first embodiment in which the biasing electrodes and the heating elements are formed by distinct portions of electrically conductive material arranged one next to the other, these elements are here formed by a single second portion of electrically conductive material for each line of pixels 102. In FIG. 4, second electrically conductive portions 130 extend parallel to the axis X such that each of the portions 130 forms both the upper electrodes, corresponding to the biasing electrodes, and the heating elements of the pixels belonging to a same line of pixels.

Each portion 130 comprises a first end 132 to which a heating potential is intended to be applied, and a second end 134 connected to a reference electrical potential, here to ground, through an electrically conductive portion 136.

In the first embodiment described previously, the pyroelectric capacitance of each pixel 102 is formed only by the part of the pyroelectric material located between the reading electrode (formed by the portion 112) and the biasing electrode (formed by the portion 114). Due to the fact that the heating element is formed beside the biasing electrode, the part of the pyroelectric material located between the heating element and the reading electrode does not form part of this pyroelectric capacitance. In the first embodiment, the heating element thus does not directly heat the portion of pyroelectric material of the pyroelectric capacitance of each pixel.

In the second embodiment shown in FIG. 4, due to the fact that the heating element and the biasing electrode of each pixel 102 are formed by a same electrically conductive portion 130, all the portion of pyroelectric material located between the reading electrode and the part of the portion 130 located facing the reading electrode forms part of the pyroelectric capacitance.

The heating of the portion of pyroelectric material is obtained by making a current circulate in the electrode intended to form the heating element. Yet, this electrode also serves for the biasing of the pyroelectric capacitance. Thus, the heating resistance of each of the pixels 102 thus also serves for the biasing of one of the electrodes of the pyroelectric capacitance of each of the pixels 102 during the measurement carried out by these pixels 102 (this biasing applied during a measurement is different from the initial biasing of the PVDF described previously).

The use of one of the upper and lower electrodes of the pixels 102 to form the heating elements is possible due to the fact that the value of the electrical potential applied to this electrode during reading of the thermal pattern is constant during reading of the charges.

In this second embodiment, a single signal is used to manage the lines of pixels 102 of the sensor 100, that is to say carry out both the control of the heating and the selection of line of pixels. If a pixel is not heated, nothing happens, and when a pixel is heated, a certain number of charges (number dependent on the element present on the pixel, ridge or valley in the case of a finger print) are generated. Thus, by carrying out the heating only of one line of pixels at a time then reading it, the electrical heating potential plays at one and the same time the role of heating and managing/locating a line of pixels.

The values of the heating voltages applied to the portions 130 are adjusted with respect to the resistivity of the metal of the portions 130 in order to produce the desired thermal energy in the pixels 102.

In an alternative of the first and second embodiments described previously, it is possible that the upper electrode and the heating element of the pixels are covered by a dielectric layer, itself covered with a first electrically conductive layer which is electrically connected to ground. This electrically conductive layer may be covered by the protective layer 109. This electrically conductive layer, including for example an electrically conductive ink, thereby forms an electromagnetic shielding between the element of which the thermal pattern is intended to be detected, for example a finger in the case of a finger print sensor 100, and the biasing electrode of each pixel, thereby avoiding the recovery of electromagnetic noise (for example noise at 50 Hz coming from the mains) in the measurements made. This electrically conductive layer also makes it possible to protect the sensor 100 vis-à-vis electrostatic discharges (ESD).

Figure 5:
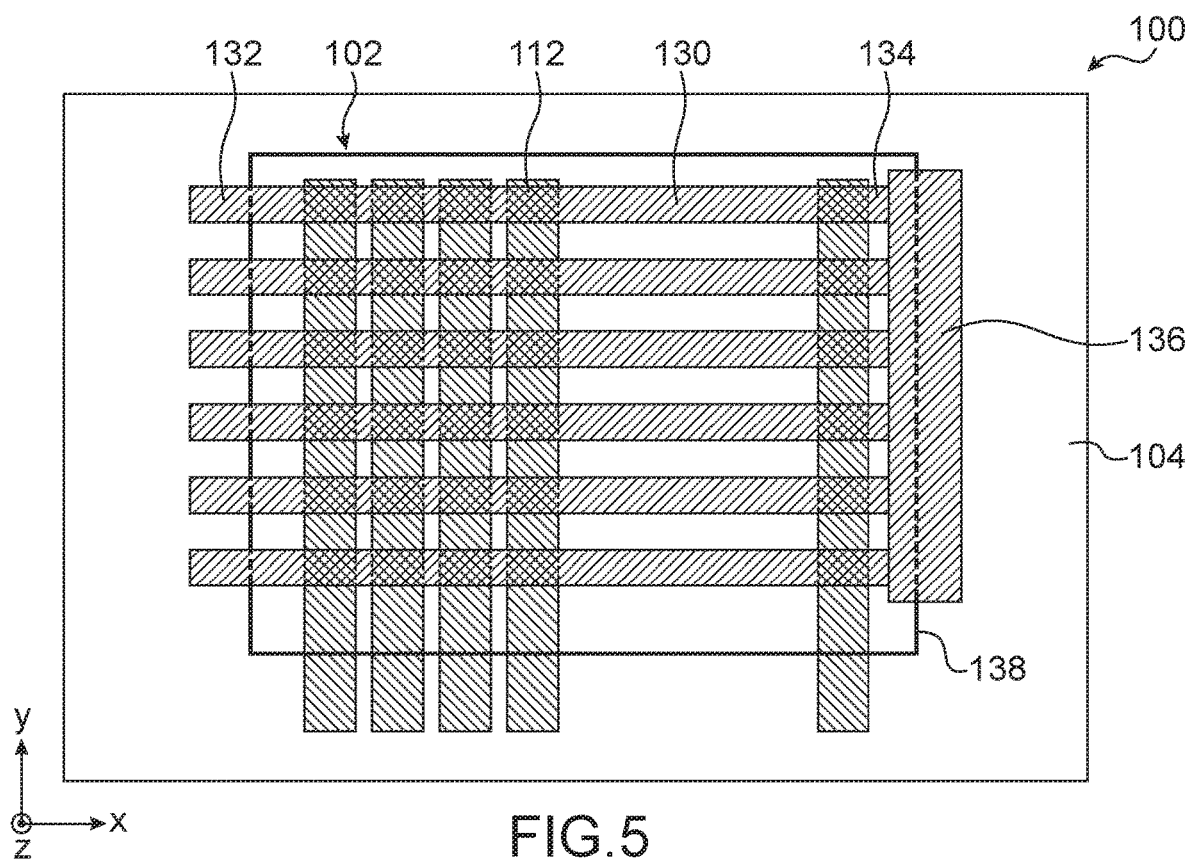
FIG. 5 shows a top view of a part of a thermal pattern sensor, the subject matter of the present invention, according to a third embodiment.

FIG. 5 shows a top view of several pixels 102 of the sensor 100 according to a third embodiment.

As in the preceding embodiments, the sensor 100 comprises the portions 112 forming the reading electrodes of the pixels that are electrically connected together within each of the columns of pixels. In addition, as in the preceding embodiments, a layer of pyroelectric material, not visible in FIG. 4, is arranged on the reading electrodes.

The pyroelectric material layer is covered by an electrically conductive layer 138, for example metallic, which is not structured and which covers the whole of the pyroelectric material layer. This electrically conductive layer 138 is connected to ground. The electrically conductive layer 138 is covered with a dielectric layer on which the portions 130 forming the heating elements of the pixels are arranged.

Compared to the preceding alternative embodiment in which an electromagnetic shielding layer is arranged above the pyroelectric capacitances, the sensor according to this third embodiment integrates this electromagnetic shielding layer directly above the pyroelectric material in using the conductive layer forming the upper electrodes of the pyroelectric capacitances of the pixels. In this configuration, little current traverses the upper and lower electrodes of the pixels. Thus, these electrodes may be advantageously produced by deposition of an electrically conductive ink, thereby facilitating the production of the sensor 100.

In order to be able to read the pixels of each line of the matrix, the heating elements of each line of pixels are subjected to a heating for a single line of pixels at the same time in order not to have, at the base of each column, the response of two pixels added together. During the heating of a line of pixels, each pixel of the heated line generates charges, which are distributed over the entire pixel column. At the base of the column, the charges generated are read.

The reading of a line of pixels is described in greater detail below.

The reading circuits are firstly reset. In the case of reading circuits such as that described previously in relation with FIG. 3, this resetting is obtained by closing the switches 56. The electrical potential of the portions 112 is at the value $V_{ref}$. The heating of the pixels of one of the lines of the matrix is next initiated by applying a heating voltage between the ends of the conductive portion forming the heating elements of the line of pixels. The pyroelectric capacitances of the pixels of this line are at this moment at a temperature $T_0$.

The switches 56 are next opened. The integration then starts at the pyroelectric capacitances of the pixels 102 of the line, during an integration time $\zeta$ for example equal to around 500 µs. Electrical charges are generated by the pyroelectric capacitances of the pixels 102 of the line during this integration time $\zeta$. Due to the fact that the switches 56 are opened, the electrical charges generated by the pyroelectric capacitances of the pixels 102 of the line flow to the capacitances 54.

At the end of this integration time $\zeta$, the pyroelectric capacitances are at a temperature $T_1$ (different from one pixel to the next) and have thus been subjected to a variation in temperature $\Delta T = T_1 - T_0$, the electrical charges generated by the pyroelectric capacitances and stored in the capacitances 54 being the consequence of this variation in temperature. The electrical potential at the output of the amplifiers 52 is thus $V_{out} = Q \cdot C_{ref} + V_{ref}$, with Q corresponding to the electrical charges generated and $C_{ref}$ the value of the capacitance 54. This potential is then read and sampled by the analogue/digital converter 58. The heating of the line of pixels is next stopped. When the operation of reading and sampling the result is finished, the switch 56 is commuted to the closed position to discharge the capacitance 54.

During such a reading, the electrical potential $V_{heat}$ applied to one of the electrodes of the pyroelectric capacitance (on the end 118 for the sensor 100 according to the first embodiment or on the end 132 for the sensor 100 according to the second and third embodiments) is constant throughout the reading of a pixel. On the other hand, due to the fact that the portion of conductive material to which this potential is applied is common to all the pixels 102 of the line of pixels associated with this portion, the value of the heating potential applied to the pyroelectric capacitances of each of these pixels 102 is different from one pixel to the next.

Considering for example the second embodiment shown in FIG. 4, the upper electrode of the pyroelectric capacitance the closest to the end 132 is subjected to a potential substantially equal to $V_{heat}$. The upper electrode of the following pyroelectric capacitance is subjected to an electrical potential substantially equal to $V_{heat}-\delta V$. The values of the electrical potentials applied to the upper electrodes of the pyroelectric capacitances decrease proportionally to their distance vis-à-vis the end 132. When the conductive portion 136 is connected to ground, the upper electrode of the final pyroelectric capacitance, corresponding to that which is the closest to the end 134, is subjected to an electrical potential substantially equal to 0 V, that is to say the electrical potential of ground. This variation in the applied electrical heating potential from one pixel to the next does not modify the heating produced from one pixel to the next due to the fact that the flow of current in the conductive portion 130 causing the heating is the same in all the second conductive portion 130 and the same for all the pixels 102 of the line because the heating resistances of all these pixels 102 are identical.

On reading a line of pixels, the values of the potentials on the biasing electrodes of each pixel are different from one pixel to the next. On the other hand, for a same variation in temperature, the difference in voltages, or the difference in number of charges, generated at the terminals of the pyroelectric capacitances of the pixels is identical. Yet, it is the excess charges generated with respect to the reference voltage that are read, whether they are positive or negative. For example, in the case of the exemplary embodiment shown in FIG. 3, the resulting reading voltage obtained at the output of the amplifier 52 is $V_{out}=V_{ref}\pm\Delta Q/Cf$, with Cf corresponding to the value of the capacitance 54, which is independent of the voltage at the terminals of the pyroelectric capacitances when the potential $V_{heat}$ is stable during the integration time.

In the exemplary embodiment described previously in relation with FIG. 3, the electrical charges generated are read directly by the amplifier 52.

The chip comprising the reading circuits 50 is advantageously produced from a silicon substrate, and transferred onto another circuit on which the pixels 102 are produced.

Due to the fact that the reading electrodes of the pixels of a same column are formed by a single conductive portion, and thus that all these reading electrodes are connected to the reading circuit during the reading of a pixel, a cooling time is preferably respected after having read one line of pixels before reading the following line of pixels so as not to take into account the negative charges generated in large quantity at the start of cooling. The duration of this cooling is for example between around 2 and 5 times the heating time. Thus, a line of pixels of the sensor 100 may be read and cooled in around 2 ms, which enables a reading of around 500 lines of pixels per second.

The reading circuit has a signal to noise ratio dependent on the value of the capacitance formed by the pixels connected to this reading circuit. The higher the capacitance, the higher the noise obtained. A compromise is thus made between the number lines of pixels of the sensor (the higher the number of lines of pixels in the sensor, the greater the number of pixels connected to each reading circuit, and the higher the noise received by the reading circuits) and the tolerable noise so that the measurement remains correct. This signal to noise ratio may also be increased by increasing the heating power of the pixels.

In the case of a sensor 100 comprising 300 lines of pixels, the total capacitance on a column corresponds to the sum of the pyroelectric capacitances of 300 pixels. With a pyroelectric capacitance of thickness equal to around 1 µm (thickness of pyroelectric material), the capacitance per column of pixels is around 100 fF×300=30 pF. Thus, the sensor 100 advantageously comprises between around 100 and 300 lines of pixels.

The table below gives the results obtained with the sensor 100 according to the second embodiment for different pixel pitches (the pitch being the distance between the centres of two neighbouring pixels).

| Pixel pitch (µm) | Dimensions of pyroelectric capacitance (µm²) | ΔT required to generate | | | Pyroelectric capacitance |
|---|---|---|---|---|---|
| | | 10000 e- | 60000 e- (4 bits) | 1000000 e- (8 bits) | |
| 50 | 40 × 40 | 34 mK | 204 mK | 3400 mK | 100 fF |
| 100 | 90 × 90 | 6.8 mK | 41 mK | 380 mK | 500 fF |

In the above table, the pyroelectric capacitance values are obtained considering a thickness of pyroelectric material equal to 1 µm.

Thus, for pixels of dimensions equal to 50 µm×50 µm, a signal of sufficient amplitude is obtained when the pixels are subjected to a variation in temperature of at least around 1K to 2K. With a protective layer 109 of thickness of the order of 2 µm, power injections per pixel of around 0.2 mW make it possible to have a sufficiently powerful output signal. The injection of heat may be adapted to obtain a variation of at least one degree in a read pixel.

Figure 8:
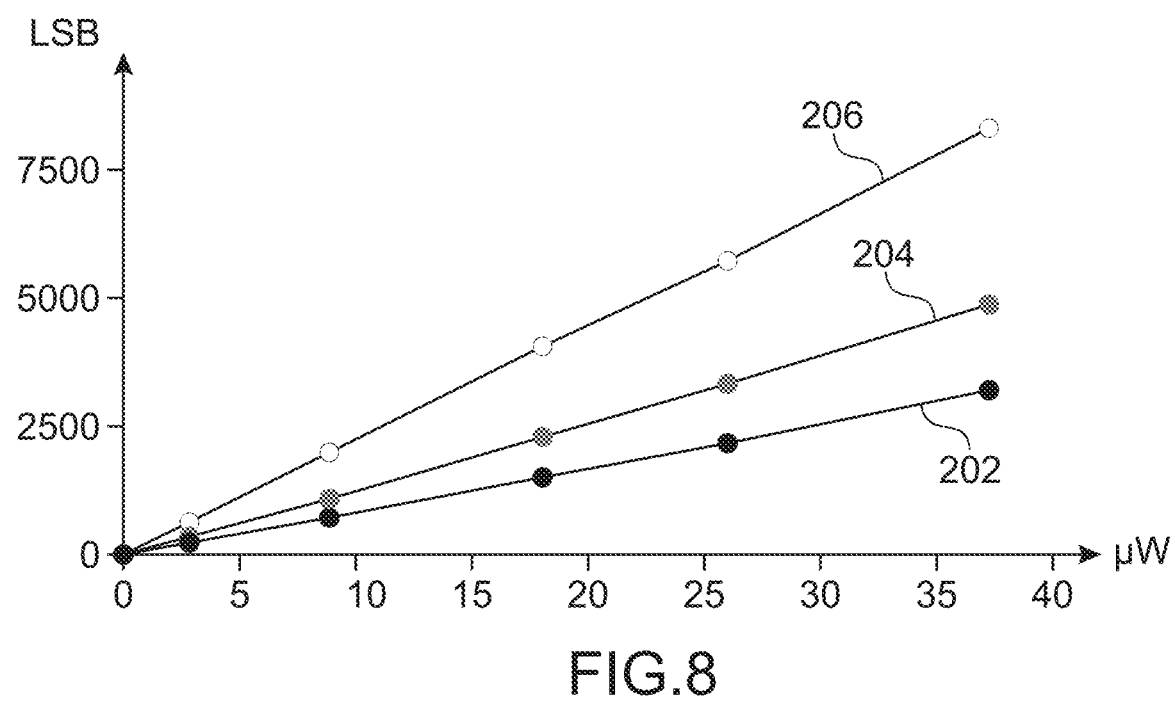
FIG. 8 shows the number of low significant bits read on an analogue/digital converter of the circuit of FIG. 3, as a function of the power injected per pixel.

The curves 202, 204 and 206 of FIG. 8 represent the number of LSB (Low Significant Bits) read on the analogue/digital converter 58 of 16 bits (here of AFE1256 type sold by Texas Instrument), i.e. a maximum of 65536 codes, as a function of the power injected per pixel (in µW), for different integration times (curve 202: $\zeta=250$ µs; curve 204: $\zeta=500$ µs; curve 206:$\zeta=1600$ µs). These curves represent the number of bits obtained between a pixel in contact with air (valley of a print) and a pixel in contact with water (ridge of a print). This number of bits is measured for example by arranging a drop of water on the sensor and measuring the difference between each side of the edge of the drop. These results also represent the maximum contrast that can be obtained. This contrast depends linearly on the injected power and on the integration time. The value of this contrast also depends on the thickness of the protective layer 109.

In the second and third embodiments shown in FIGS. 4 and 5, the portions 130 form conductive strips of uniform width (dimension along the axis Y) extending along a line of pixels 102. Heat is thus diffused in a uniform manner along each conductive strip.

Figure 6:
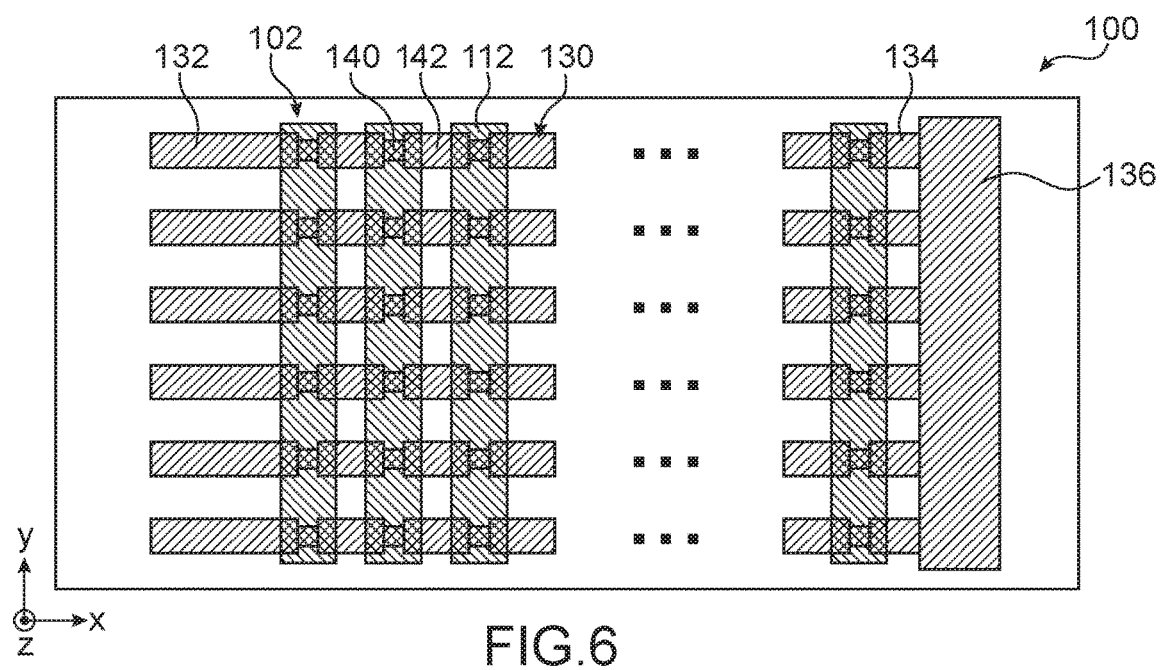
FIG. 6 shows a top view of a part of a thermal pattern sensor, the subject matter of the present invention, according to an alternative of the second and third embodiments.

According to an alternative embodiment shown in FIG. 6 which can apply to the second and third embodiments, the width of each of the portions 130 is not uniform over its entire length. Parts 140 of each portion 130 located facing the central parts of the portions 112 of each pixel 102, that is to say centred on each pixel 102, have a lower width than that of other parts 142 arranged astride above two pixels and each connecting two parts 140. This alternative embodiment makes it possible to concentrate the heating produced on each pixel 102 and to limit losses of heat between the pixels 102 due to the fact that the electrical resistance increases at the junction between a part 140 and an adjacent part 142 (these junctions being located on the pixels 102 and not between the pixels 102), which causes a greater Joule effect and a greater injection of heat at these junctions. The fact of having hot points centred on the pixels 102 also reduces problems of diathermy, that is to say the lateral transfer of heat between neighbouring pixels. This alternative leads however to a slight reduction in the pyroelectric charges generated on account of the reduction in surface of the pyroelectric material facing the portions 130, which signifies that a compromise has to be found between the different thermal parameters, the reading speeds, etc.

These hot points centred on the pixels 102 may be produced not by reducing the width of each of the portions 130 at the pixels 102, but by reducing the thickness of conductive material of the portions 130 at the pixels 102.

In an alternative of the embodiments described previously, it is possible that the portions 112 of the different columns of pixels 102 can be initially (that is to say during the production of the sensor 100) electrically connected together in order that the initial biasing voltage of the pyroelectric material can be applied to each portion 112 from a single access point. Next, during the singularisation of the sensors (during the cutting of the wafer from which several sensors are produced), the conductive line connecting the portions 112 is eliminated, thereby electrically isolating the portions 112 from each other within each sensor.

In the example of reading lines of pixels described previously, the heating elements of each line of pixels are turned on and turned off successively, with a cooling phase between each triggering of the heating of one of the lines of pixels.

In an alternative, it is possible that during the reading of each line of pixels, apart from the heating carried out by the heating elements associated with this line of pixels, the heating elements associated with one or more preceding lines of pixels are also turned on. This is possible because the measurements carried out for these preceding lines of pixels may be used to recover the values of the line of pixels read. For example, for the reading of the first line of pixels 102, only the heating elements of this first line of pixels are turned on. After extinction of these heating elements and waiting for cooling of the first line of pixels, the reading of the second line of pixels may be carried out by triggering the heating elements associated with the second line of pixels but also the heating elements of the first line of pixels. The values outputted by the second line of pixels may be recovered using the measurement results obtained when the heating elements of the two lines of pixels are turned on, as well as the preceding measurement results obtained during the heating of the first line of pixels. Thus, the measurements are obtained from linear combinations resorting to measurements of the lines of pixels read previously.

According to this alternative of reading pixels where the heating elements of several lines of pixels are simultaneously activated, it is possible to heat successively several lines of pixels without awaiting cooling before heating a following line of pixels. Thus, it is for example possible to heat the first line of pixels, then another line of pixels without awaiting the cooling of the first line of pixels, etc. The different lines of pixels heated successively are advantageously arranged not immediately one next to the other in order to limit diathermy between the different lines of pixels. For example, it is possible to heat the first line of pixels, then the fifth line of pixels, etc. This alternative is advantageous when the sensor 100 comprises a limited number of lines of pixels, for example less than 10 lines of pixels. In addition, in this alternative, the reading of the charges is carried out at the moment where the read pixels reach quasi-thermal equilibrium, for example around 90% of the thermal equilibrium of the pixels.

Moreover, it is also possible that the heating powers applied for the different lines of pixels are not all similar. For example, during a reading without cooling between readings of the different lines of pixels and to limit the impact of the charges generated during cooling of the lines of pixels read previously, it is possible to increase, at each new line of read pixels, the power with which the line of pixels read is heated with respect to the power with which the preceding line of pixels has been heated.

Finally, it is also possible not to reset the reading circuits on reading each line of pixels.

In all the embodiments, the diathermy effects taking place between neighbouring pixels may be compensated by applying digital processings on the measurements made, for example of Wiener filter type. In addition, to reduce these diathermy phenomenon effects, the lines of pixels are preferably heated such that two adjacent lines of pixels are not heated immediately one after the other. For example, considering a sensor 100 including 8 lines of pixels numbered successively from 1 to 8 (the line 1 located at the top of the sensor 100 and the line 8 located at the bottom of the sensor 100), it is possible to heat and read the lines of pixels in the following order: 1, 3, 5, 7, 2, 4, 6 and 8. In this case, the line of pixels heated is spaced apart from a pixel with respect to the line of pixels heated previously (except for the heating of the line 2 of which the pixels are spaced apart by 4 pixels with respect to the line 7). Thus, the initial temperatures of the read pixels are substantially more equal with each other than if the read pixels undergo a heating due to diathermy and which is not cooled enough before the reading. It is also possible that the heated line of pixels is spaced apart by more than one pixel with respect to the line of pixels heated previously, for example spaced apart by two or three pixels, or even more in the case of a sensor 100 comprising a larger number of lines of pixels.

Figure 7:
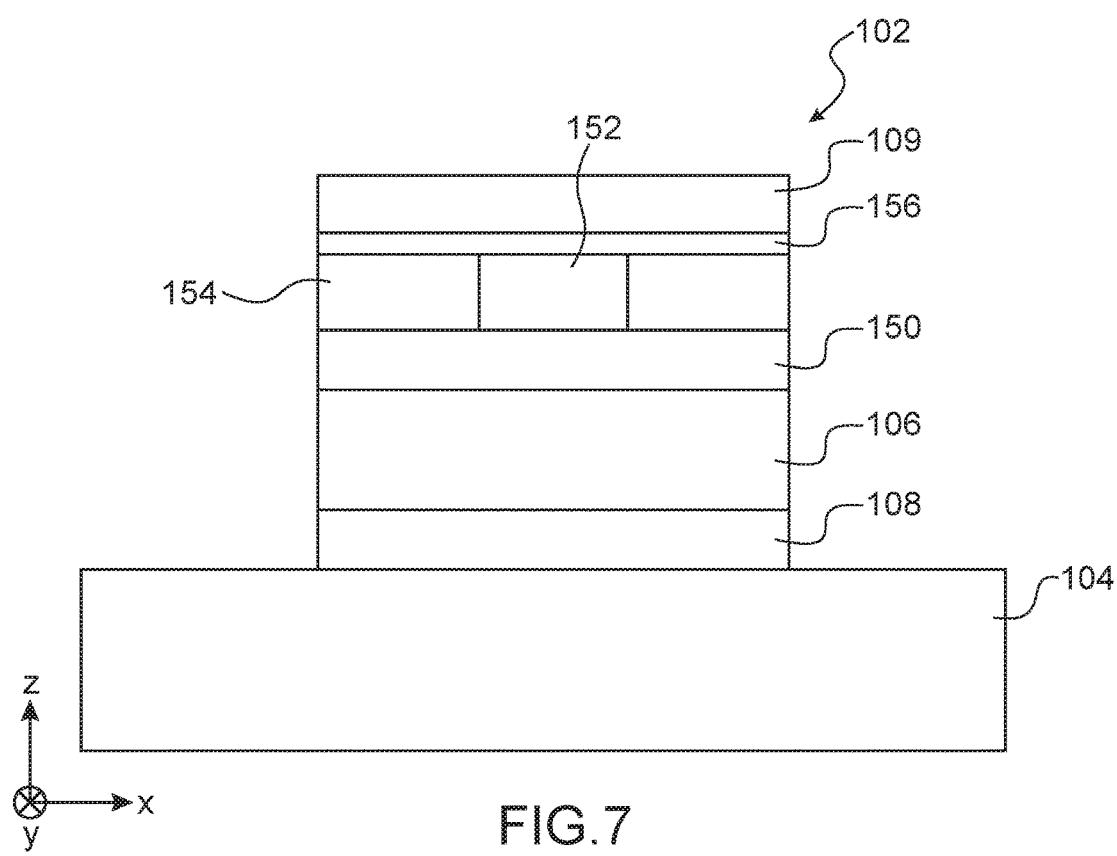
FIG. 7 shows a sectional view of a part of a pixel of a thermal pattern sensor, the subject matter of the present invention, according to an alternative embodiment.

In the embodiments described previously, the heating elements are formed by portions of an electrically conductive layer in which the current circulates in the plane of this layer. In an alternative, it is possible that the heating elements are formed by several layers and/or superimposed electrically conductive portions, as shown schematically in FIG. 7. In this figure, the heating element of the pixel 102 is formed by a first conductive portion 150 forming the upper electrode of the pixel 102, a resistive element 152 arranged on the first conductive portion 150 and within a dielectric layer 154, and a second conductive portion 156 arranged on the dielectric layer 154 and the element 152. The heating current is brought from the layer 150, traverses the element 152 while producing heat and is conveyed to ground through the second portion 156 (which is connected to ground). Such an alternative has the advantage of dissociating the location of the heating element vis-à-vis that of the upper electrode, while conserving the advantages brought by sharing the heating function and the biasing function of the pixels within a same electrically conductive element. It is thereby possible to correctly centre the element 152 at the middle of the pixel 102 in order to concentrate the heat generated in the pixel 102 as much as possible.

In an alternative of the embodiments described previously, the conductive portions serving both for the biasing of the pyroelectric capacitances and for the heating of the pyroelectric material of the pixels 102 may correspond not to those forming the upper electrodes 110 of the pixels 102 but those forming the lower electrodes 108 of the pixels 102. In addition, shapes, or designs, of the conductive portion(s) that form the electrodes of the pyroelectric capacitance of each pixel 102 and the heating elements of these pixels 102 other than those described previously may be envisaged.

Although not shown, the sensor 100 comprises a control circuit making it possible to apply the control signals described above to drive the reading of the pixels 102 via the sending of signals into the heating elements to trigger the start-up of the heating of the desired pixels.

The thermal pattern detected by the sensor 100 advantageously corresponds to a finger print, but may correspond to any pattern having a thermal capacitance and a specific heat capacity.

Although not shown, the sensor 100 may further comprise an electronic processing circuit able to construct an overall image of the thermal pattern from the measurements made at each of the pixels 102. This electronic processing circuit may also be able to compare this image with several images stored in a database in order to identify if the detected pattern corresponds to one of those stored in the database. The electronic processing circuit may also be able to display an image of the detected thermal pattern.

Moreover, the sensor 100 advantageously comprises, in addition to the thermal detection elements described previously, optical or capacitive detection elements making it possible to detect an image of the element of which the thermal pattern is also detected. Thus, the sensor 100 may comprise a matrix of optical detection pixels interlaced with thermal detection pixels.

What is claimed is:

1. A thermal pattern sensor comprising a matrix of several lines and columns of pixels, each pixel including at least:
    a pyroelectric capacitance formed by at least one portion of pyroelectric material arranged between a lower electrode and an upper electrode, in which a first of the lower and upper electrodes corresponds to a reading electrode of the pixel, and
    a heating element configured to heat the at least one portion of the pyroelectric material of the pyroelectric capacitance of said pixel during a measurement of the thermal pattern by the pyroelectric capacitance of said pixel,
    and in which:
    for each line of pixels, heating elements of pixels of each corresponding line are configured to heat the at least one portions of the pyroelectric material of the pixels of each corresponding line independently of the heating elements of pixels of remaining lines, and
    for each column of pixels, corresponding reading electrodes of each pixel of said column are electrically connected together and formed by at least one first electrically conductive portion in contact with corresponding at least one portions of the pyroelectric material of the pixels of said column and distinct from first electrically conductive portions forming reading electrodes of the pixels other remaining columns.

2. The thermal pattern sensor according to claim 1, in which:
    in each pixel, a second of the lower and upper electrodes corresponds to a biasing electrode of the pixel distinct from the heating elements, and
    in each line of pixels, the heating elements of the pixels of each corresponding line and biasing electrodes of the pixels of each corresponding line are juxtaposed and arranged on or under the corresponding at least one portion of the pyroelectric material of the pixels of each corresponding line.

3. The thermal pattern sensor according to claim 1, in which, in each line of pixels, at least one second electrically conductive portion forms both the heating element and a second of the lower and upper electrodes of each of the pixels of the corresponding line.

4. The thermal pattern sensor according to claim 1, further comprising a dielectric layer covering the upper electrode of each pixel of the matrix and a first electrically conductive layer arranged on said dielectric layer.

5. The thermal pattern sensor according to claim 1, in which:
    a second of the lower and upper electrodes of each pixel is formed by a second electrically conductive layer common to all the pixels of the matrix and configured to be electrically connected to a reference electrical potential, and
    in each line of pixels, at least one second electrically conductive portion forms the heating elements of the pixels.

6. The thermal pattern sensor according to claim 5, in which the second electrically conductive layer is arranged between the heating elements and the reading electrodes.

7. The thermal pattern sensor according to claim 3, in which each second electrically conductive portion comprises, in each pixel, parts of which an electrical resistance is greater than the electrical resistance of a remainder of said second electrically conductive portion.

8. The thermal pattern sensor according to claim 1, in which, for each line of pixels, the heating elements of the pixels of each corresponding line are electrically connected together and formed by at least one second electrically conductive portion distinct from the heating elements of the pixels of the remaining lines and configured to heat simultaneously all the portions of pyroelectric material of the pixels of the corresponding line.

9. The thermal pattern sensor according to claim 1, in which the reading electrodes correspond to the lower electrodes of the pixels.

10. The thermal pattern sensor according to claim 1, in which the reading electrodes correspond to the upper electrodes of the pixels.

11. The thermal pattern sensor according to claim 1, in which each of the heating elements comprises several superimposed electrically conductive portions.

12. A method for producing a thermal pattern sensor comprising a matrix of several lines and columns of pixels, including at least the implementation of the following steps:
    producing, for each pixel, a pyroelectric capacitance formed by at least one portion of pyroelectric material arranged between a lower electrode and an upper electrode, in which a first of the lower and upper electrodes corresponds to a reading electrode of the pixel, and
    producing a heating element configured to heat the at least one portion of the pyroelectric material of the pyroelectric capacitance of said pixel during a measurement of the thermal pattern by the pyroelectric capacitance of said pixel, and in which:

for each line of pixels, heating elements of the pixels of each corresponding line are configured to heat the at least one portion of the pyroelectric material of the pixels of each corresponding line independently of heating elements of pixels of the remaining lines, and for each column of pixels, corresponding reading electrodes of each pixel of said column are electrically connected together and formed by at least one first electrically conductive portion in contact with corresponding at least one portion of the pyroelectric material of the pixels of said column and distinct from first electrically conductive portions forming the reading electrodes of the pixels of the remaining columns.

13. The method according to claim 12, in which at least one of the following steps comprises the implementation of at least one deposition by printing of at least one electrically conductive material: the production of the lower electrodes of the pixels, the production of the upper electrodes of the pixels, or production of the heating elements of the pixels.

\* \* \* \* \*